United States Patent [19]
Kochel et al.

[11] 3,988,723
[45] Oct. 26, 1976

[54] HALF-FREQUENCY FEED RING GENERATOR OF SINGLE WALL DOMAINS

[75] Inventors: Le Roy J. Kochel, Fridley; Stanley J. Lins, Minneapolis, both of Minn.

[73] Assignee: Sperry Rand Corporation, New York, N.Y.

[22] Filed: Sept. 8, 1975

[21] Appl. No.: 611,105

[52] U.S. Cl. .................................... 340/174 TF
[51] Int. Cl.² .................................... G11C 11/02
[58] Field of Search ............... 340/174 BG, 174 CL, 340/174 TF

[56] References Cited
UNITED STATES PATENTS
3,879,585  4/1975  Bobeck .................... 340/174 BG

*Primary Examiner*—Thomas B. Habecker
*Attorney, Agent, or Firm*—Kenneth T. Grace; Thomas J. Nikolai; Marshall M. Truex

[57] ABSTRACT

A generator of single wall domains, i.e., bubbles, for a bubble memory system is disclosed. The generator includes a closed feed ring, constructed of a repetitive pattern of magnetically soft chevrons, having merging input and output channels of similar chevron design. A nucleator in the input channel, driven at one-half the frequency of the rotating in-plane field, generates a bubble every other cycle of the in-plane field frequency such that only alternate positions along the input channel, and correspondingly the feed ring, are initially filled with bubbles. The bubbles, as driven around the four 90° corners of the feed ring, are delayed one complete cycle of the in-plane field frequency such that the generated bubbles from the input channel and the bubbles in the feed ring fill alternate positions along the feed ring. Thus, after the first generated bubble completes two complete cycles of the feed ring, the feed ring is filled. Once the feed ring is filled, the nucleator is no longer used, as the feed ring, via the output channel, continually feeds bubbles to the associated major loop.

3 Claims, 34 Drawing Figures

BIT POSITIONS

STABLE POSITIONS

HALF-FREQUENCY FEED RING GENERATOR OF SINGLE WALL DOMAINS

BACKGROUND OF THE INVENTION

The generation of bubbles for memory and logic systems has for many years occupied considerable effort to develop the optimum design for high frequency, reliable operation — see the publication "A New Approach to Memory and Logic — Cylindrical Domain Devices," A. H. Bobeck, et al, Proceedings of the Fall Joint Computer Conference, 1969, pp. 489–498. A most recent publication — see publication "Progress in All-Permalloy Bubble Control Functions," T. J. Nelson, AIP Conference Proceedings, No. 18, Part 1, Magnetism and Magnetic Materials — 1973 (19th Annual Conference — Boston), pp. 95–99, with particular reference to FIGS. 3, 4 — has proposed a design of an all-Permalloy nucleator, feed ring and replicator that merge bubbles into a major loop. This Nelson design requires operation of a Permalloy nucleator of conventional size, i.e., 6–7 microns ($\mu$m), bubbles such that the frequency and current limitations and bias margins thereof are much lower than desired. The present invention is considered to be an improvement invention over this Nelson design.

SUMMARY OF THE INVENTION

The generator of the present invention includes a closed feed ring that is constructed of a repetitive pattern of magnetically soft, i.e., Permalloy, chevrons which feed ring has merging input and output channels of similar chevron design. An aluminum-copper nucleator in the input channel, driven at one-half the frequency of the rotating in-plane field, generates a small size bubble, i.e., less than 2 $\mu$m, every other, i.e., alternate, cycle of the in-plane field frequency such that only alternate positions along the input channel, and correspondingly the feed ring, are initially filled with bubbles. The bubbles, during their passage around the feed ring, are delayed one complete cycle of the in-plane field frequency such that the newly generated bubbles, as they enter the feed ring from the input channel, and the bubbles that are already in the feed ring, fill alternate, interleaved positions along the feed ring. Thus, after the first generated bubble has completed two complete cycles of the feed ring, the feed ring is completely filled. Once the feed ring is completely filled, the nucleator is no longer utilized because the feed ring, via the output channel, continuously feeds bubbles to the associated major loops at the in-plane field frequency. An active aluminum-copper annihilator and passive replicator or, alternatively, an active aluminum-copper replicator, may be utilized to control the flow of the bubbles in the major loop.

DESCRIPTION OF THE PREFERRED EMBODIMENTS

Figure 1:
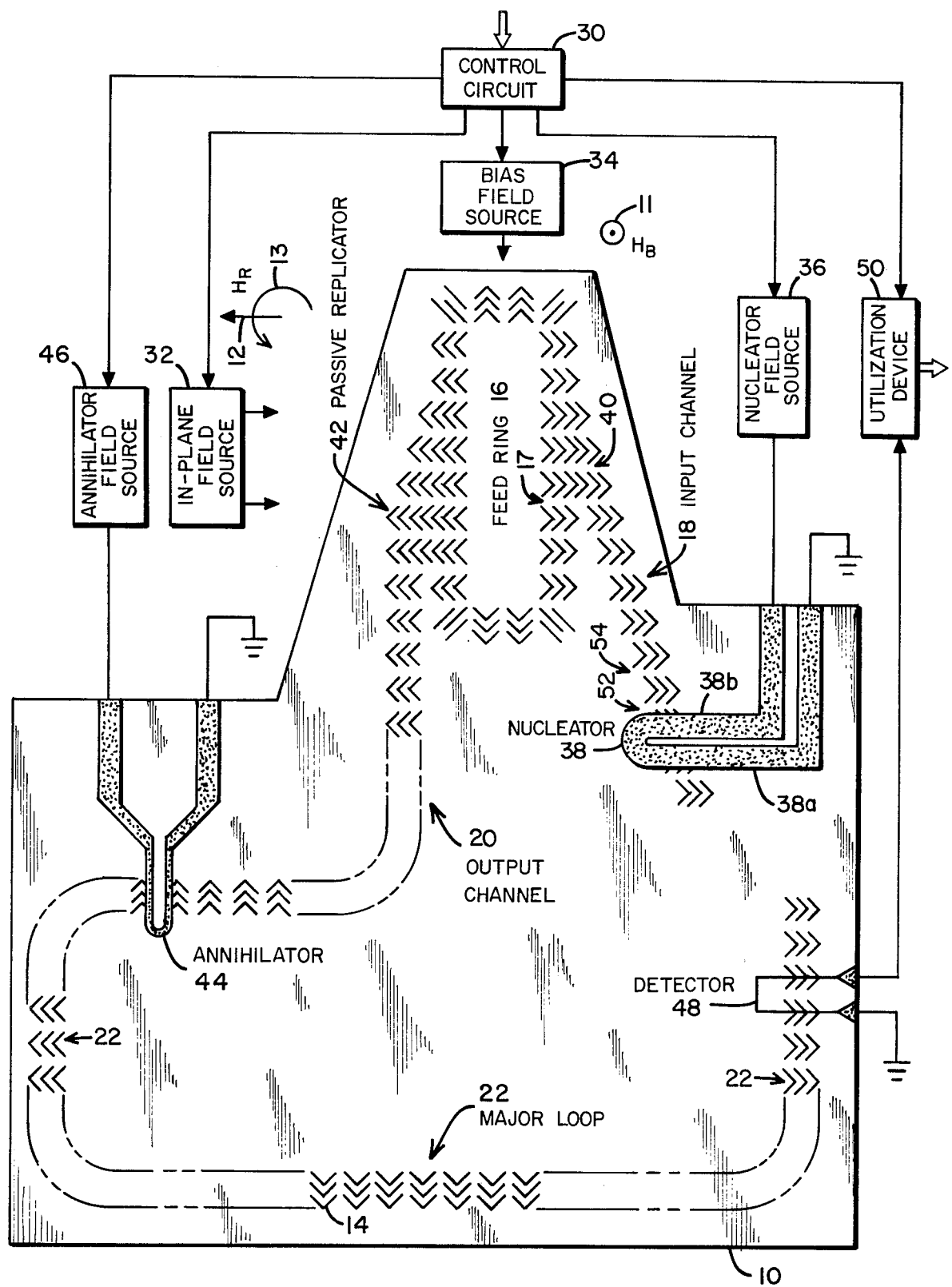
FIG. 1 is a schematic diagram of a first embodiment of the present invention.

With particular reference to FIG. 1 there is presented an illustration of a schematic diagram of a first embodiment of the present invention. The bubble memory system of FIG. 1 includes a layer 10 of magnetizable material in which single wall domains can be sustained and moved when concurrently subjected to a bias field $H_B$ that is directed upwardly normal to the plane of the layer 10 as indicated by vector 11 and a rotating in-plane field $H_R$, as indicated by vector 12, that rotates at a frequency $F_R$ in the counterclockwise direction in the plane of the layer 10 as indicated by vector 13. A fine-grained pattern of magnetically soft, i.e., Permalloy, chevrons or elements 14 define a plurality of channels along which the single wall domains or bubbles are moved under the influence of the concurrent normal-to-the-plane bias field $H_B$ and the in-plane field $H_R$. The chevrons 14 in the illustrated embodiment of FIG. 1 are configured in a closed feed ring 16, a merging input channel 18 and a diverging output channel 20 that, in turn, merges into a major loop 22.

Overall operation of the bubble memory of FIG. 1 is as follows. Under control of control circuit 30, in-plane field source 32 provides the rotating in-plane field $H_R$, represented by vector 12, while bias field source 34 provides the normal-to-the-plane of layer 10 bias field $H_B$, represented by vector 11, both of which in-plane field $H_R$ and the normal-to-the-plane bias field $H_B$ may be provided by a configuration of Helmholtz coils such as illustrated in the A. H. Bobeck U.S. Pat. No. 3,534,347. Under control of control circuit 30 and in phase with the in-plane field $H_R$, nucleator field source 36 couples to aluminum-copper alloy nucleator 38 a current of sufficient intensity, which in the area between the two adjacent patterns of chevrons 14 and beneath the nucleator 38, generates the single wall domains or bubbles that via input channel 18 are coupled to and fed into feed ring 16. The bubbles are generated at one-half the frequency $F_R$, e.g., 10 megahertz (MHz), of the in-plane field $H_R$, i.e., at a frequency of $F_R/2$, under the concurrent influence of the in-plane field $H_R$ and the bias field $H_B$. These bubbles are moved along the input channel 18 occupying every other, or alternate, stable position for the bubbles as provided by the repetitive serialized pattern of chevrons 14 defined by input channel 18, feed ring 16 and output channel 20. The term "stable position" is used in this discussion to refer to the position that a bubble would take if all motion of the bubble were frozen when the rotating in-plane field $H_R$ was in the orientation denoted by the $H_R$ vector 12.

Figure 2:
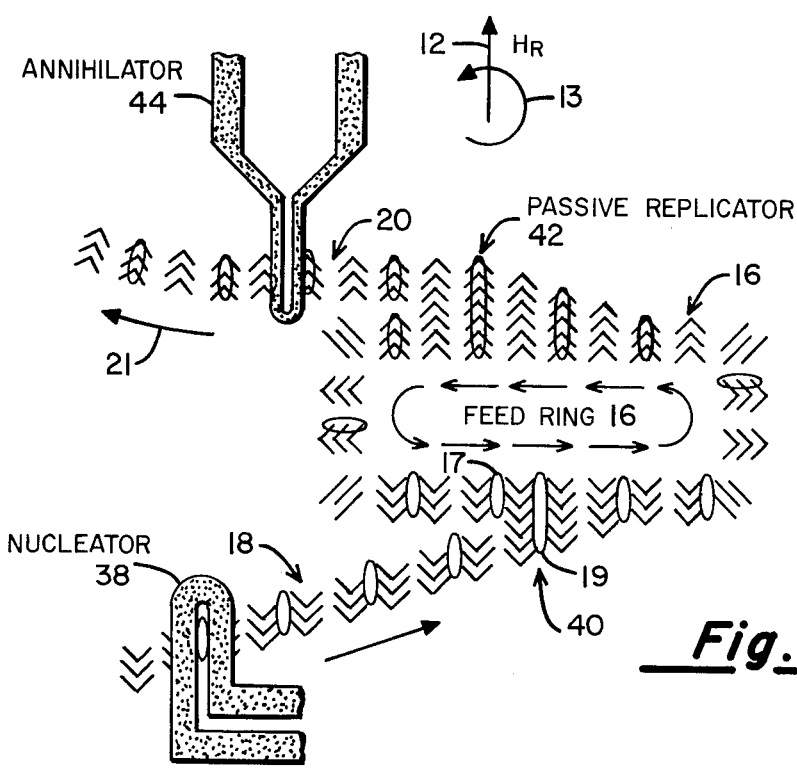
FIG. 2 is a schematic diagram of the embodiment of FIG. 1 illustrating the positions of the bubbles after the first generated bubble has completed one complete cycle around the feed ring of FIG. 1.

After a sufficient number of cycles, or 360° rotations of the in-plane field $H_R$ in its counterclockwise rotation as denoted by vector 12, the first bubble generated by nucleator 38 has passed along the path defined by input channel 18, merged into feed ring 16 until the so first generated bubble is in the last stable position 17 between the two adjacent patterns of chevrons 14 and just immediately prior to the merging portions of input channel 18 and feed ring 16 as denoted by reference numeral 40. With particular reference to FIG. 2 there is presented a schematic diagram of the embodiment of FIG. 1 illustrating the positions of the bubbles after the first generated bubble has completed one complete cycle around the feed ring 16 of FIG. 1.

The embodiment of FIG. 1 utilizes a passive replicator 42 — see the P. I. Bonyhard U.S. Pat. No. 3,868,661 for an exemplary passive replicator design — for replicating the bubbles in feed ring 16 into output channel 20. The bubbles, as they flow along output channel 20 and merge into major loop 22 pass beneath and are influenced by annihilator 44. The annihilator field source 46 under control of control circuit 30 and in phase with the in-plane field $H_R$ at its frequency $F_R$ selectively effects the bubbles passing within the influence of annihilator 44 for selectively annihilating or not annihilating the bubbles as they pass thereunder for the selective writing of a 0 or a 1 into the major loop 22 from the source of the bubbles including output channel 20, passive replicator 42, feed ring 16, input channel 18 and nucleator 38. Major loop 22, being defined as that portion of the repetitive serialized patterns of chevrons 14 downstream of annihilator 44, terminates just downstream of detector 48 which, via utilization device 50 under control of control circuit 30, detects the presence or absence of the bubbles as they pass under the detector 48 — see A. H. Bobeck, et al, U.S. Pat. No. 3,706,081 for an exemplary annihilator and detector design.

Figure 3:
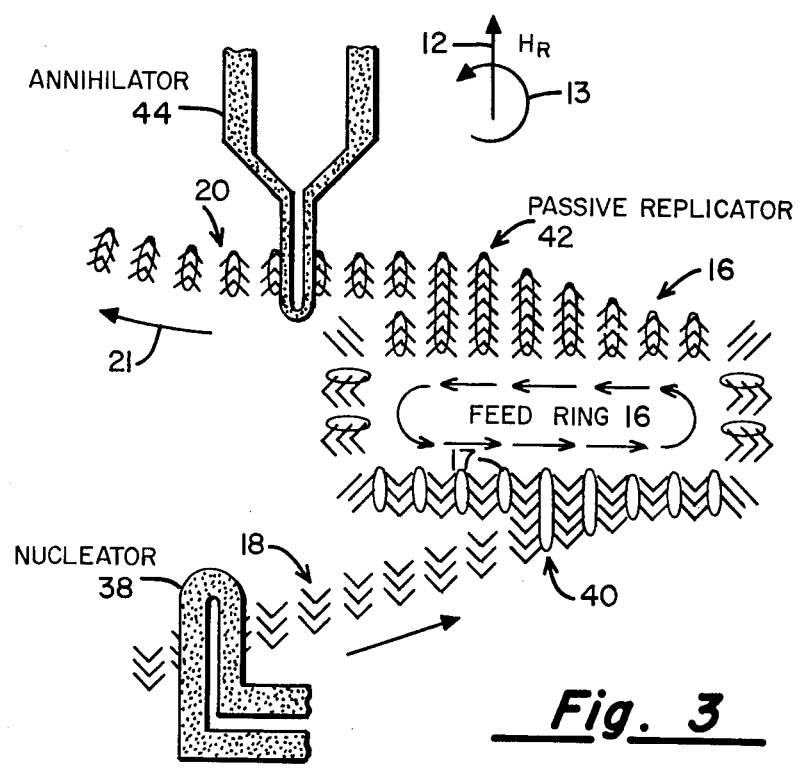
FIG. 3 is a schematic diagram of the embodiment of FIG. 1 illustrating the positions of the bubbles after the first generated bubble has completed two complete cycles around the feed ring of FIG. 1.

After the nucleator 38 has completed a sufficient number of cycles of the in-plane field $H_R$, at one-half its frequency $F_R$, i.e., at a frequency $F_R/2$, during which a bubble is generated by nucleator 38 at every other or alternate 360° rotation of the in-plane field $H_R$ as denoted by vector 12, the first generated bubble from nucleator 38 and input channel 18 has passed around feed ring 16 and first achieved stable position 17 as represented by the illustrated configuration of FIG. 2. The nucleator 38 continues generating bubbles at this same one-half in-plane field $H_R$ frequency $F_R$ such that after this first generated bubble has completed two complete cycles of the feed ring to achieve stable position 17 the second time, the feed ring 16 is filled. With particular reference to FIG. 3 there is presented a schematic diagram of the embodiment of FIG. 1 illustrating the positions of the bubbles after the first generated bubble has completed two complete cycles around the feed ring 16 of FIG. 1.

At this time, then, with the bubbles occupying every next adjacent stable position of feed ring 16, as illustrated in FIG. 3, nucleator field source 36 is turned OFF whereby nucleator 38 is no longer required to perform its nucleation and generation of the bubbles in input channel 18. Once the feed ring 16 is filled with bubbles at every adjacent stable position along its closed path, passive replicator 42 continues its function of replicating each and every bubble in feed ring 16 into output channel 20 for providing in output channel 20 a bubble in each and every stable position. Annihilator 44 then, under control of annihilator field source 46 and control circuit 30 selectively annihilates or does not annihilate the bubbles as provided by the output channel 20 for coupling to major loop 22 the desired bit configuration of a serial string of 0'and/or 1'in major loop 22 to be detected by detector 48 and utilization device 50.

With particular reference to FIG. 1, the nucleator 38 is a current loop which, under control of the nucleator field source 36, causes the generation of the nucleate field that is required to generate the bubbles in the area between the two parallel adjacent legs 38a, 38b of nucleator 38 in the area intermediate or between the two adjacent patterns of chevrons 14 that are superposed beneath nucleator 38. The two parallel adjacent legs 38a, 38b of nucleator 38 in the area of the two adjacent patterns of chevrons 14 between which the bubbles are generated is much wider than normal to permit a relatively high current carrying capacity for preventing high current density damage thereto.

This wider-than-normal conductor width of the two adjacent parallel legs of nucleator 38 in the area of the two adjacent superposed patterns of chevrons 14 requires that nucleator 38 be operated at alternate cycles to prevent the collapsing of a previously generated bubble. If operated at every cycle $F_R$ of the in-plane field $H_R$, each bubble would be one stable position downstream of nucleator 38, as at stable position 52, rather than at stable position 54 as provided by nucleator 38 when operated at every alternate cycle, i.e., $F_R/2$ of the in-plane field frequency $F_R$. This alternate period or one-half the in-plane field frequency $F_R$ also allows nucleator 38 to be turned OFF during the alternate period operation. This permits an additional time for nucleator 38 to cool and thus maintain its operating temperature below its destructive limit that would be othersise achieved at the same current density if nucleator 38 were operated at every cycle of the in-plane field frequency $F_R$.

Additionally, feed ring 16 is comprised of an odd number of stable positions for the bubbles as they flow around the closed loop thereof such that as the bubbles propagate around feed ring 16 at the in-plane field frequency $F_R$, two complete circuits of the first generated bubble from nucleator 38 are required to fill feed ring 16 after which the bubbles are replicated by passive replicator 42 and coupled to output channel 20 at the in-plane field frequency $F_R$ with a bubble in every next adjacent stable position in output channel 20. Accordingly, once feed ring 16 is filled at the operating frequency of $F_R/2$ of nucleator 38, passive replicator 42 supplies major loop 22, via output channel 20, serialized bubbles at the in-plane field frequency $F_R$. The embodiment of FIG. 1, excluding major loop 22, has bias margins that are at least as great as the bias margins of major loop 22.

Figure 4A:
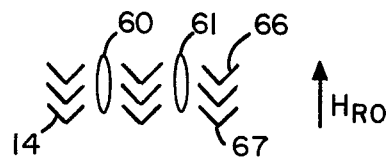
FIGS. 4a, 4b, 4c are illustrations of the stable bubble positions of the illustrated patterns of chevrons when subjected to a zero phase field $H_{R0}$ of the in-plane field $H_R$.
Figure 4C:
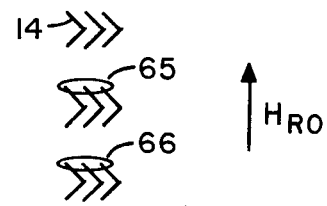
Figure 4B:
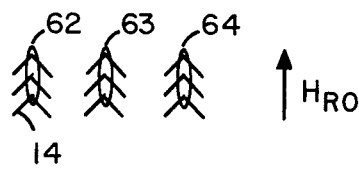
Figure 5A:
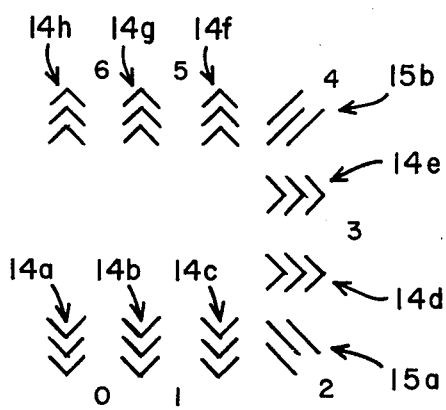
FIGS. 5a and 5b are illustrations of the successive bit positions and corresponding stable positions, respectively, as a bubble is cycled around two 90° turns of the feed ring of FIG. 1.
Figure 5B:
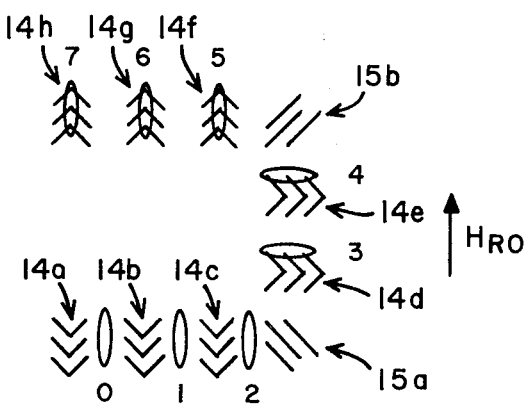
Figure 6A:
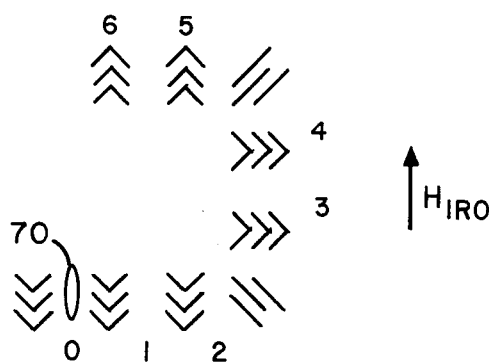
FIGS. 6a through 6y are illustrations of the successive stable positions of FIG. 4 and the related in-plane field vectors.
Figure 6B:
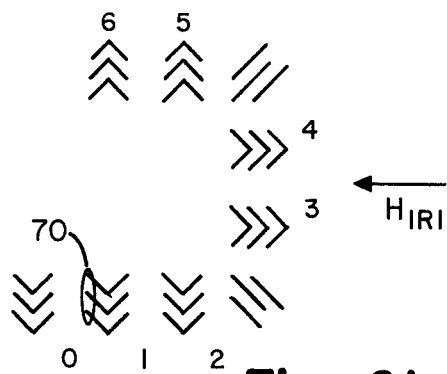
Figure 6F:
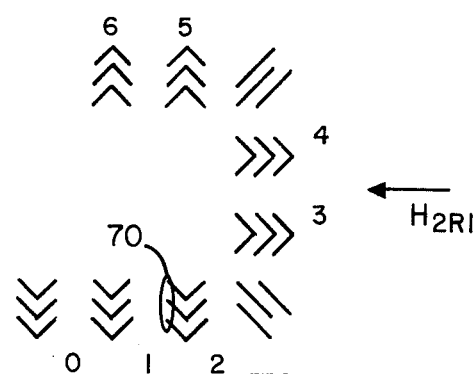
Figure 6C:
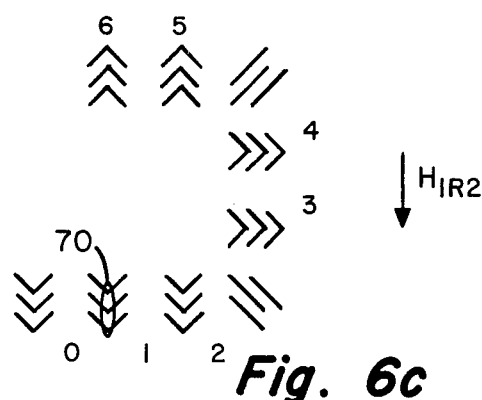
Figure 6G:
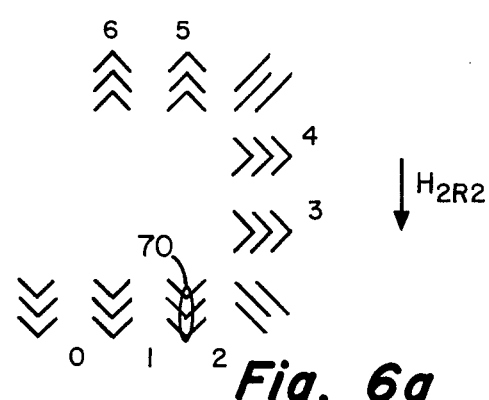
Figure 6D:
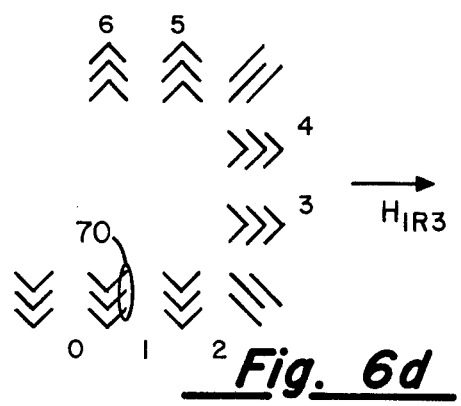
Figure 6H:
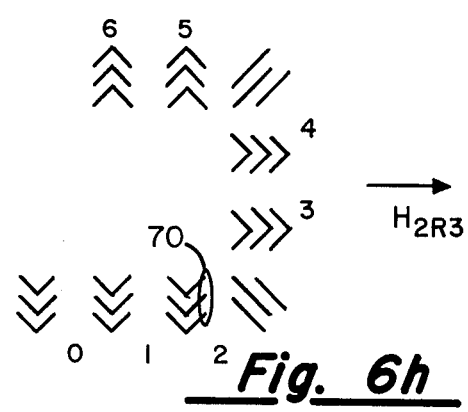
Figure 6E:
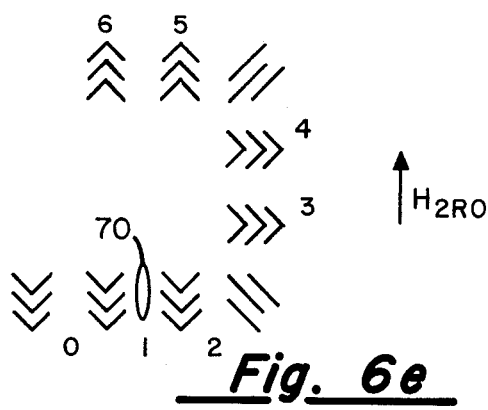
Figure 6I:
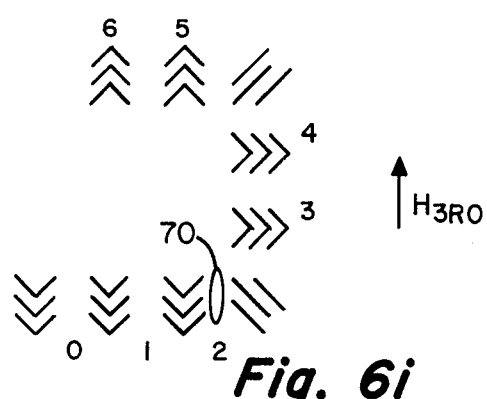
Figure 6J:
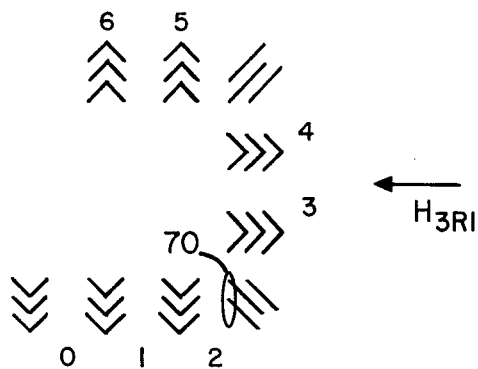
Figure 6N:
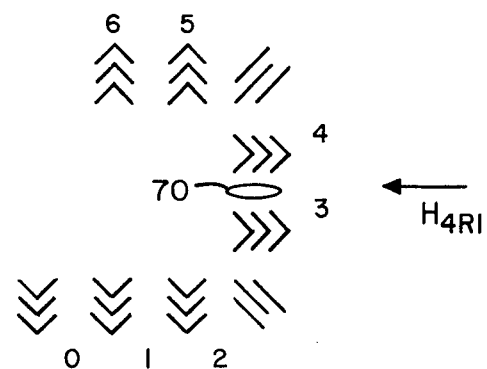
Figure 6K:
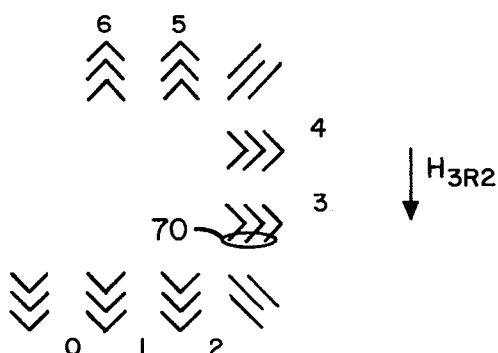
Figure 6O:
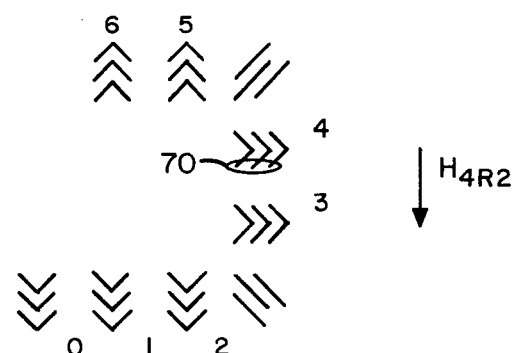
Figure 6L:
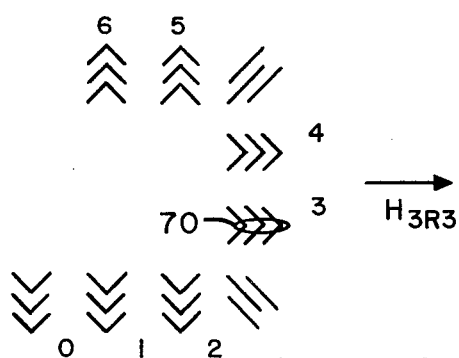
Figure 6P:
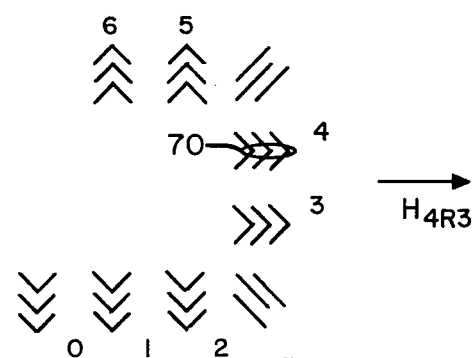
Figure 6M:
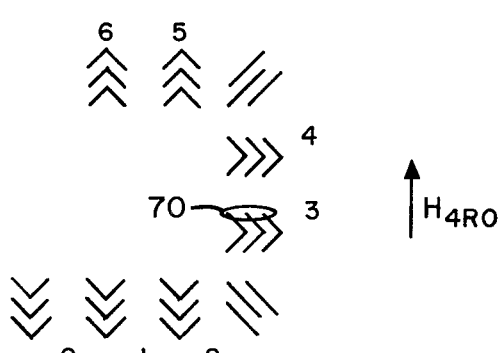
Figure 6Q:
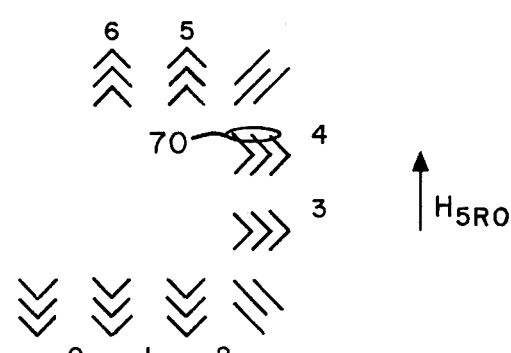
Figure 6R:
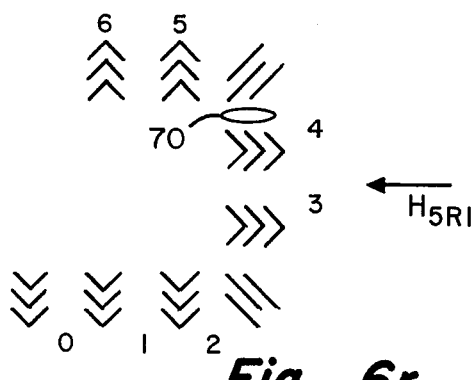
Figure 6V:
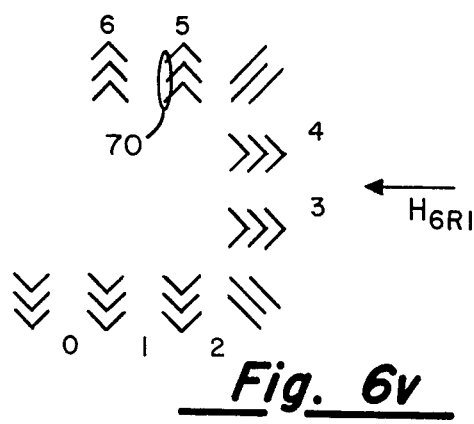
Figure 6S:
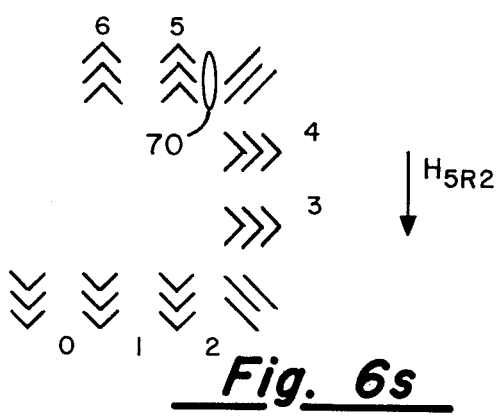
Figure 6W:
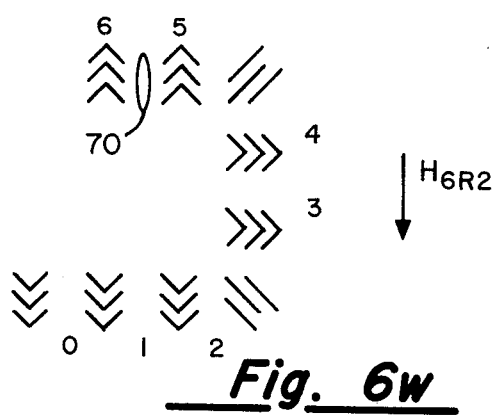
Figure 6T:
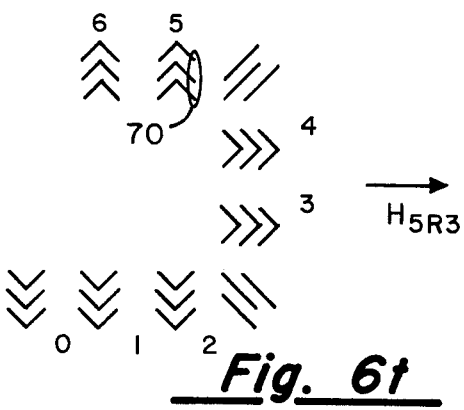
Figure 6X:
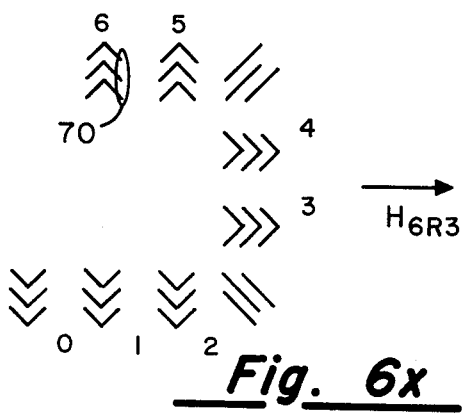
Figure 6U:
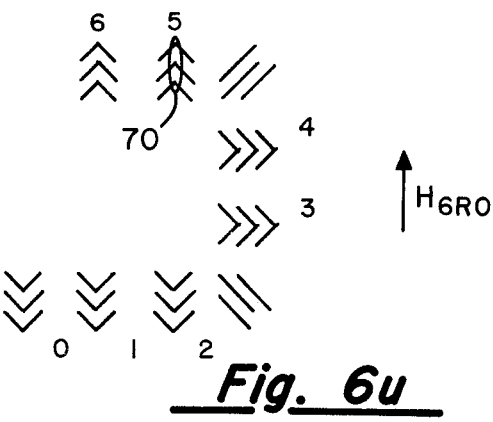
Figure 6Y:
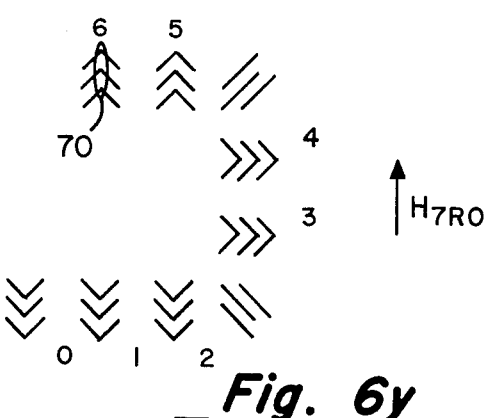

The following discussion, with particular reference to FIGS. 4, 5 and 6, is directed toward an explanation of the 180° loss of a stable position of the bubbles (as they are cycled around the two 90° turns of the portion of the feed ring 16 that is illustrated in FIG. 5b) with respect to the phase of the rotating in-plane field $H_R$ as illustrated in more detail in FIGS. 6a through 6y. Initially, with particular reference to FIGS. 4a, 4b, 4c there are illustrated the adjacent stable positions 60, 61 and 62, 63, 64 and 65, 66 when the bubble memory 10 of FIG. 1 is subjected to the 0 phase field $H_{R0}$ (schematically represented by the vertical upwardly directed vector) of the rotating in-plane field $H_R$ (represented by the counterclockwise rotating vector 12 of FIG. 1).

In the configuration of FIG. 4a with the crests 66 and the troughs 67 of the chevrons 14 oriented in the downward direction, the upwardly directed 0 phase field $H_{R0}$ of the rotating in-plane field $H_R$ causes the adjacent stable positions 60, 61 to be oriented between the crests 66 of adjacent patterns of chevrons 14.

In contrast, in FIG. 4b with the crests 66 and the troughs 67 oriented in an upward direction, the 0 phase field $H_{R0}$ of the rotating in-plane field $H_R$ causes the adjacent stable positions 62, 63, 64 to be oriented along the troughs 67 of each pattern of chevrons 14. With the crests 66 and the troughs 67 of the chevrons 14 directed 90° with respect to the 0 phase field $H_{R0}$ of the rotating in-plane field $H_R$, as in FIG. 4c, the adjacent stable positions are oriented along the crests 66 of each pattern of chevrons 14 normal to the direction of the 0 phase field $H_{R0}$.

In the illustrated configurations of FIGS. 4a, 4b, 4c for each 360° rotation of the rotating in-plane field $H_R$, as at each successive 0 phase field $H_{R0}$, a bubble will be caused to move from one stable position to the next downstream adjacent stable position, e.g., as from stable position 60 to stable position 61. Thus, for each complete rotation of the rotating in-plane field $H_R$ each bubble is caused to be moved downstream to the next adjacent stable position.

With particular reference to FIGS. 5a, 5b there are represented illustrations of the successive bit positions and stable positions, respectively, as a bubble is cycled around two 90° turns of feed ring 16 of FIG. 1. FIG. 5a illustrates the successive bit positions that a bubble would normally be expected to occupy if the 0 phase field $H_{R0}$ of the rotating in-plane field $H_R$ were always directed as illustrated in FIG. 4a, i.e., directed parallel to the line of the pattern (being aligned antiparallel to the direction of the troughs 67 of the patterns of chevrons 14 and aligned with the patterns of 45° angulated lines 15). With this orientation of the 0 phase field $H_{R0}$, at each successive 0 phase field $H_{R0}$, each successive bit position 0–6 is positioned between the crests 66 of each successive adjacent pattern of chevrons 14 (the patterns 15a, 15b of 45° angulated lines 15 are considered to be between the crests 66 of adjacent patterns 14c, 14d and 14e, 14f of chevrons 14). For the configuration of FIG. 5b, at each successive 0 phase field $H_{R0}$ of the rotating in-plane field $H_G$, as from an initial stable bubble position 0, a bubble will be moved successively into successive stable position 1 (between crests 66 of adjacent patterns 14b, 14c of chevrons 14), stable position 2 (between crests 66 of pattern 14c of chevrons 14 and adjacent ends of 45° angulated lines 15 of pattern 15a), stable position 3 (along the upper crests 66 of chevrons 14 of pattern 14d), stable position 4 (along the upper crests 66 of chevrons 14 of pattern 14e), stable position 5 (along the through 67 of chevrons 14 of pattern 14f) and stable position 6 (along the troughs 67 of chevrons 14 of pattern 14g). Thus it can be seen that a bubble originally in stable position 0 of FIG. 5b has suffered a delay of 180° (of rotation of the rotating in-plane field $H_R$) in its passage from stable position 0 to stable position 7. This is illustrated by the orientation of stable position 6 being along the troughs 67 of pattern 14g of chevrons 14 while the orientation of the corresponding bit position is between the crests 66 of adjacent patterns 14g, 14h of chevrons 14.

With particular reference to FIGS. 6a through 6y, there are presented illustrations of the successive stable positions of FIG. 4a, 4b, 4c and the related in-plane field $H_R$ vectors at successive 90° counterclockwise rotational positions. FIGS. 6a, 6b, 6c, 6d, 6e are illustrations of the stable positions of a bubble 70 that is initially positioned at stable position 0 when initially subjected to the upwardly directed 0 (zero'th) phase field $H_{1R0}$ — of FIG. 6a — and is then successively subjected to the left-wise directed 1 (first) phase field $H_{1R1}$ — of FIG. 6b, the downwardly directed 2 (second) phase field $H_{1R2}$ — of FIG. 6c, the right-wise directed 3 (third) phase field $H_{1R3}$ — of FIG. 6d, and, lastly, the upwardly directed 0 phase field $H_{2R0}$ — of FIG. 6e. During this complete or 360° rotation of the in-plane field $H_R$, bubble 70 is moved one full bit position — from bit position 0 to bit position 1 — see FIG. 5a — which corresponds to moving from stable position 0 to stable position 1 — see FIG. 5b.

FIGS. 6e, 6f, 6g, 6h, 6i are illustrations of the successive stable positions of bubble 70 that is initially positioned at stable position 1 when initially subjected to the upwardly directed 0 phase field $H_{2R0}$ — of FIG. 6e — and is then successively subjected to the left-wise directed 1 phase field $H_{2R1}$ — of FIG. 6f, the downwardly directed 2 phase field $H_{2R2}$ — of FIG. 6g, the right-wise directed 3 phase field $H_{2R3}$ of FIG. 6h, and, lastly, the upwardly directed 0 phase field $H_{3R0}$ of FIG. 6i.

FIGS. 6i, 6k, 6l, 6m are illustrations of the successive stable positions of bubble 70 that is initially positioned at stable position 2 when initially subjected to the upwardly directed 0 phase field $H_{3R0}$ — of FIG. 6i — and is then successively subjected to the left-wise directed 1 phase field $H_{3R1}$ — of FIG. 6j, the downwardly directed 2 phase field $H_{3R2}$ — of FIG. 6k, the right-wise directed 3 phase field $H_{3R3}$ — of FIG. 6l, and, lastly, the upwardly directed 0 phase field $H_{4R0}$ — of FIG. 6m. During this complete rotation of the in-plane field $H_R$ bubble 70 has not moved into a bit position — as into bit position 3 — see FIG. 5a —, but is now oriented behind the orientation of bit position 3, i.e., along the uppermost crests 66 of pattern 14d of chevrons 14 and is now positioned in stable position 3 — see FIG. 5b.

FIGS. 6m, 6n, 6o, 6p, 6q are illustrations of the successive stable positions of a bubble 70 that is initially positioned at stable position 3 when initially subjected to the upwardly directed 0 phase field $H_{4R0}$ — of FIG. 6m — and is then successively subjected to the left-wise directed 1 phase field $H_{4R1}$ — of FIG. 6n, the downwardly directed 2 phase field $H_{4R2}$ — of FIG. 6o, the right-wise directed 3 phase field $H_{4R3}$ — of FIG. 6p, and, lastly, the upwardly directed 0 phase field $H_{5R0}$ — of FIG. 6q. During this complete rotation of the in-plane field $H_R$, bubble 70 has not moved into a bit position — as into bit position 4 — see FIG. 5a, but is still oriented behind the orientation of bit position 4, i.e., along the uppermost crests 66 of pattern 14e of chevrons 14 and is now positioned in stable position 4 — see FIG. 5b.

FIGS. 6q, 6r, 6s, 6t, 6u are illustrations of the successive stable positions of bubble 70 that is initially positioned at stable position 4 when initially subjected to the upwardly directed 0 phase field $H_{5R0}$ — of FIG. 6q — and is then successively subjected to the left-wise directed 1 phase field $H_{5R1}$ — of FIG. 6r, the downwardly directed 2 phase field $H_{5R2}$ — of FIG. 6s, the right-wise directed 3 phase field $H_{5R3}$ — of FIG. 6t, and, lastly, the upwardly directed 0 phase field $H_{6R0}$ — of FIG. 6u. During this complete rotation of the in-plane field $H_R$, bubble 70 has again not moved one complete bit position — as from bit position 4 to bit position 5 — see FIG. 5a — but is now farther behind with respect to the rotating in-plane field $H_R$ such that bubble 70 is now oriented 180° behind the orientation of bit position 5, i.e., along the vertically aligned troughs 67 of pattern 14f of chevrons 14, and is now positioned in stable position 5 — see FIG. 5b.

FIGS. 6u, 6v, 6w, 6x, 6y are illustrations of the successive stable positions of bubble 70 that is initially positioned at stable position 5 when initially subjected to the upwardly directed 0 phase field $H_{6R0}$ — of FIG. 6u — and is then successively subjected to the left-wise directed 1 phase field $H_{6R1}$ — of FIG. 6v, the downwardly directed 2 phase field $H_{6R2}$ — of FIG. 6w, the right-wise directed 3 phase field $H_{6R3}$ — of FIG. 6x, and, lastly, the upwardly directed 0 phase field $H_{7R0}$ — of FIG. 6y. During this complete rotation of the in-plane field $H_R$ bubble 70 has moved the equivalent of one full bit position, from stable position 5, being oriented along the upwardly directed troughs 67 of pattern 14f of chevrons 14, to stable position 6, being oriented along the upwardly directed troughs 67 of pattern 14g of chevrons 14. Thus, bubble 70 has in its passage along the path defined by patterns 14a through 14h of chevrons 14 suffered a delay equivalent to a 180° rotation of the rotating in-plane field $H_R$. Accordingly, it is apparent that bubble 70, when completing its passage around feed ring 16 of FIG. 1, has passed through four 90° turns such as illustrated in FIGS. 6a through 6y such that bubble 70 in completing one complete circle of feed ring 16 will have suffered an equivalent delay with respect to the rotating in-plane field $H_R$ of 360° such that, as illustrated in FIG. 2, bubble 70 will be in the stable position 17 rather than the next downstream adjacent stable position 19. Accordingly, this delay being designed into the construction of feed ring 16 permits the equivalence of an odd number of stable positions for the bubbles as they flow around the closed loop of feed ring 16 such that the bubbles being cycled by the in-plane field $H_R$ at its frequency $F_R$ in the area of the merging section 40 of input channel 18 and feed ring 16 fill alternate stable positions within feed ring 16 until the first generated bubble within feed ring 16 has completed two complete cycles around feed ring 16.

Figure 7:
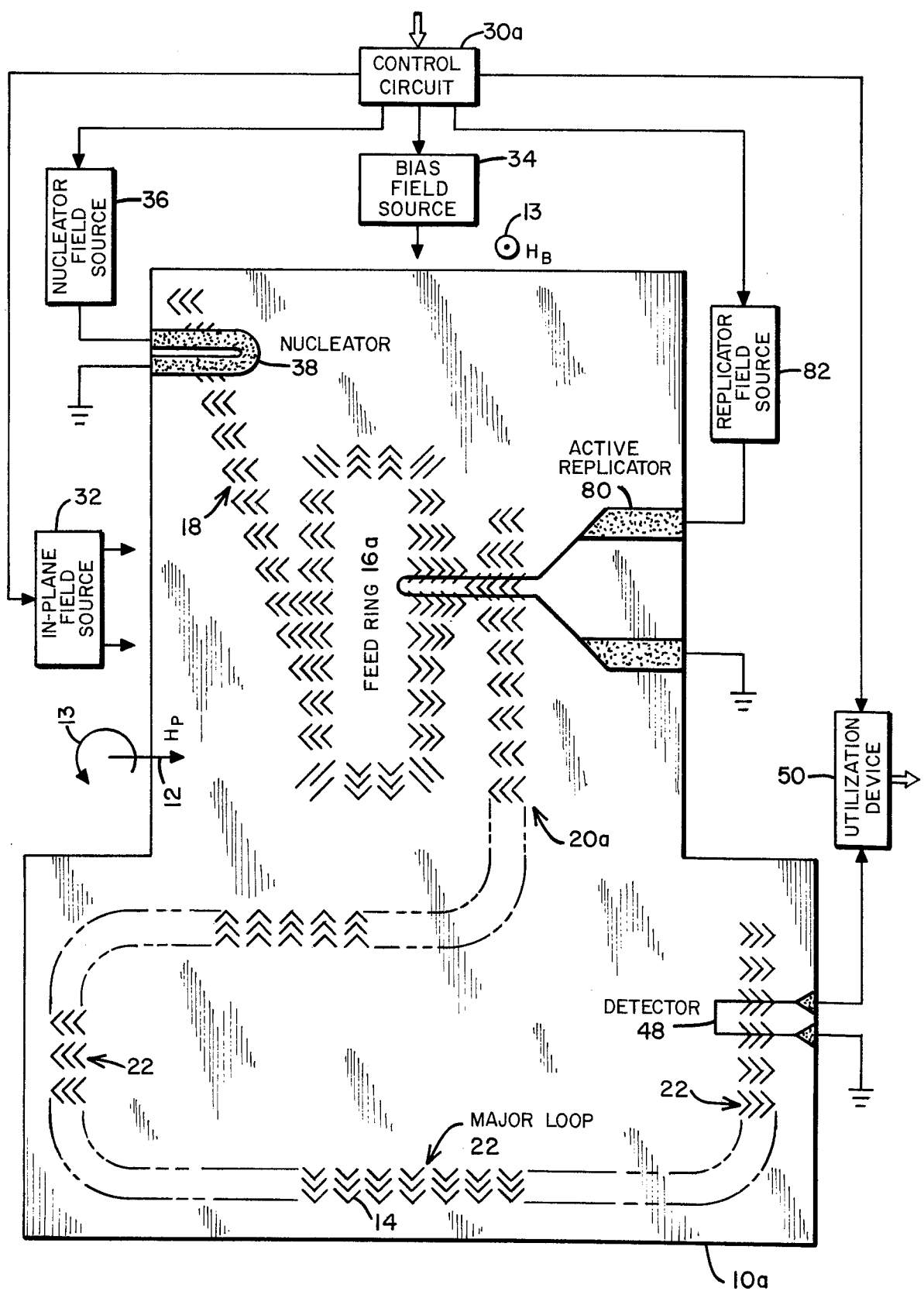
FIG. 7 is a schematic diagram of a second embodiment of the present invention.

With particular reference to FIG. 7 there is presented a schematic diagram of a second embodiment of the present invention. The embodiment of FIG. 7 is substantially similar to that of FIG. 1 except that the embodiment of FIG. 1 utilizes a passive replicator 42 for replicating the bubbles in feed ring 16 into output channel 20 while an active annihilator 44 is utilized to selectively annihilate or not annihilate the bubbles provided by passive replicator 42 for the selective writing of a 0 or a 1 into the major loop 22. In contrast to the embodiment of FIG. 1, the embodiment of FIG. 7 utilizes an active replicator 80 — see the A. H. Bobeck, et al, U.S. Pat. No. 3,810,133 for an exemplary active replicator design — which under control of replicator field source 82 and control circuit 30a selectively replicates or does not replicate the bubbles in feed ring 16a for selectively writing a 0 or a 1 into the output channel 20a and thence into major loop 22.

What is claimed is:
1. A bubble memory system, comprising:
a layer of magnetizable material in which magnetic bubbles may be generated and moved about;
a closed loop feed ring having a merging input channel;
a bias field $H_B$ directed normal-to-the-plane of said layer;
a rotating in-plane field $H_R$ directed in the plane of said layer and rotating at a frequency of $F_R$;
said feed ring and said input channel being comprised of a plurality of stable positions arranged in a predetermined path for moving bubbles therealong when subjected to the conjoint action of said bias field $H_B$ and said in-plane field $H_R$;
a generator inductively coupled to said input channel for generating bubbles in said input channel at a frequency that is one half the frequency $F_R$ of said in-plane field $H_R$, said so generated bubbles occupying alternate, or every other, stable position in said input channel;
first and subsequent bubbles that are generated by said generator in said input channel entered into said feed ring at the merging portion of said input channel and said feed ring and then traversing said feed ring one complete cycle while in alternate stable positions, and then the bubbles in said input channel entering said feed ring in the other alternate stable positions not occupied by said first and subsequent bubbles for occupying all the stable positions in said feed ring.

2. A bubble memory system, comprising:
a layer of magnetizable material in which single wall domains or bubbles may be generated and moved about;
a major loop;
a closed loop feed ring having a merging input channel and a diverging output channel that, in turn, merges into said major loop;
a bias field $H_B$ directed normal to the plane of said layer;
a rotating in-plane field $H_R$ directed in the plane of said layer and rotating at a frequency of $F_R$;
said major loop, said feed ring, said input channel and said output channel each being comprised of a plurality of stable positions arranged in a predetermined path for moving bubbles therealong when subjected to the conjoint action of said bias field $H_B$ and said in-plane field $H_R$.
a generator inductively coupled to said input channel for generating in said input channel bubbles at a frequency $F_R/2$ that is one-half the frequency $F_R$ of said in-plane field $H_R$, said so generated bubbles occupying alternate, or every other, stable position in said input channel;
first and subsequent bubbles that are generated by said generator at said frequency $F_R/2$ in said input channel entered into said feed ring at the merging portion of said input channel and said feed ring and then traversing said feed ring one complete cycle while in alternate stable positions, and then said first and subsequent bubbles in said feed ring merging with the bubbles entering said feed ring from said input channel.

3. A bubble memory system, comprising:
a layer of magnetizable material in which single wall domains or bubbles may be generated and moved about;
a major loop;
a closed loop feed ring having a merging input channel and a diverging output channel that, in turn, merges into said major loop;

a nonmagnetic substrate for supporting said layer, said major loop, said feed ring, said input channel and said output channel;

a bias field $H_B$ directed normal-to-the-plane of said layer;

a rotating in-plane field $H_R$ directed in the plane of said layer and rotating at a frequency of $F_R$;

said major loop, said feed ring, said input channel and said output channel being comprised of a plurality of separated, repetitive, serialized patterns of chevron-shaped elements of magnetically soft material, said serialized patterns of chevron-shaped elements arranged in predetermined paths for forming a plurality of stable positions and moving bubbles therealong from stable position to next adjacent stable position when subjected to the conjoint action of said bias field $H_B$ and said in-plane field $H_R$;

a generator inductively coupled to said input channel for generating in said input channel bubbles at a frequency $F_R/2$ that is one-half the frequency $F_R$ of said in-plane field $H_R$, said so generated bubbles occupying alternate, or every other, stable position in said input channel;

first and subsequent bubbles that are generated by said generator at said frequency $F_R/2$ in said input channel entered into said feed ring at the merging portion of said input channel and said feed ring and then traversing said feed ring one complete cycle while in alternate stable positions, and then said first and subsequent bubbles in said feed ring merging with the bubbles entering said feed ring from said input channel for occupying interleaved alternate stable positions in said merging portion.

* * * * *